US007787975B2

(12) United States Patent
Garcia

(10) Patent No.: US 7,787,975 B2
(45) Date of Patent: Aug. 31, 2010

(54) RESTORING AUDIO SIGNALS

(75) Inventor: Guillermo Daniel Garcia, Petaluma, CA (US)

(73) Assignee: Berkley Integrated Audio Software, Inc., Petaluma, CA (US)

( * ) Notice: Subject to any disclaimer, the term of this patent is extended or adjusted under 35 U.S.C. 154(b) by 1353 days.

(21) Appl. No.: 11/139,865

(22) Filed: May 26, 2005

(65) Prior Publication Data

US 2009/0285410 A1 Nov. 19, 2009

(51) Int. Cl.
*G06F 17/00* (2006.01)
*G10K 11/16* (2006.01)
*H03B 29/00* (2006.01)
*H04B 15/00* (2006.01)
*H04B 1/10* (2006.01)

(52) U.S. Cl. ..................... 700/94; 381/71.12; 381/94.4; 381/94.8; 375/350

(58) Field of Classification Search ................ 381/94.4, 381/94.8, 71.12; 704/226–228; 375/285, 375/346, 350; 700/94
See application file for complete search history.

(56) References Cited

U.S. PATENT DOCUMENTS 3,947,636 A * 3/1976 Edgar ........................ 381/94.8
5,268,760 A * 12/1993 Suyama ...................... 348/624
6,292,654 B1 * 9/2001 Hessel et al. ................ 455/223
6,385,261 B1 * 5/2002 Tsuji et al. .................. 375/346
6,654,471 B1 * 11/2003 Varga ........................ 381/94.8
2004/0190649 A1 * 9/2004 Endres et al. ............... 375/326

FOREIGN PATENT DOCUMENTS

EP 0 336 685 A2 10/1989
WO WO 98/05031 2/1998

OTHER PUBLICATIONS

PCT International Search Report for PCT/US2006/020374, 4 pages, Mailed Oct. 5, 2006.
"Appendix III to ITU-T Recommendation G.726 and Appendix II to ITU-T Recommendation G.727: Comparison of ADPCM Algorithms," ITU-T: General Aspects of Digital Transmission Systems, May 1994, pp. 1-41, XP002399190, Geneva.
T. Kasparis et al., "Suppression of Impulsive Disturbances from Audio Signals," Electronics Letters, IEE Stevenage, GB, vol. 29, No. 22, Oct. 28, 1993, pp. 1926-1927, XP000421547. ISSN: 0013-5194.

* cited by examiner

*Primary Examiner*—Curtis Kuntz
*Assistant Examiner*—Jesse A Elbin
(74) *Attorney, Agent, or Firm*—File-EE-Patents.com; Jay A. Chesavage

(57) ABSTRACT

Methods, systems, and apparatus, including computer program products, for restoring audio signals. A data sequence of samples representing an audio signal is received. Multiple filter coefficients are defined for a filter, and a current sample in the data sequence is selected to be processed. The filter coefficients are updated based on a previous sample preceding the current sample in the data sequence and a filtered value determined by the filter for the previous sample. A filtered value for the current sample is determined using the filter with the updated filter coefficients. The filtered value of the current sample is used to determine whether the current sample has been corrupted by impulsive noise, for example, a crackle.

36 Claims, 4 Drawing Sheets

500

600

700

RESTORING AUDIO SIGNALS

BACKGROUND

The present invention relates to removing impulsive noise from corrupted audio signals.

Audio signals are mechanical, magnetic or electric signals representing sound that can be perceived by humans. Audio signals can be recorded using analog or digital techniques. Digital techniques record audio signals on machine readable digital media, such as a compact disk (CD). Analog signals can be recorded, for example, on a phonograph disk or on a magnetic tape.

Audio signals that are generated from analog recordings or received through noisy transmissions are often corrupted by impulsive noise such as crackles and clicks. In the case of old phonograph records, for example, crackles and clicks are generated by dirt, scratches, chemical or biological degradation. Crackles and clicks are different types of impulsive noise. Clicks are high amplitude impulses that are not necessarily additive and may completely corrupt the clean audio signal. Crackles are short, small amplitude impulses that are additively superimposed on the clean audio signal. Although a single crackle lasts only for a small fraction of the period of the sound upon which it is superimposed, an audio signal from an old phonograph record can include many crackles that produce a typical “frying” noise.

Crackles can be removed from the audio signal with a number of techniques. Typically, the crackles are first identified in the audio signal, and next the identified crackles are removed. Some of these techniques assume a particular waveform for crackles. Such crackles are identified in the audio signal based on correlations between the assumed waveform and the audio signal. Other techniques identify crackles in the audio signal using linear prediction. Traditionally, the linear prediction is used to split the audio signal into two parts, where the first part includes the bulk of the clean signal and the second part includes a residue of the clean signal and all the crackles. The crackles are removed from the second part, which is then recombined with the first part. Such linear prediction techniques typically require extensive calculation, such as solving matrix equations, and are often implemented in complex and expensive special hardware.

For digital sound processing, an audio signal is represented by a data sequence that can be generated by periodically sampling an analog audio signal. Typical sampling frequencies are between about 16,000 and 96,000 samples per second. The audio data sequence is often processed by digital filters that suppress or enhance components of the audio signal. For example, speech can be enhanced over background audio using special finite impulse response (“FIR”) filters.

A FIR filter provides a filtered value for a current sample based on the current or other samples in the data sequence, but without using previously generated filtered values. The FIR filter is called a causal filter if it does not use samples that follow the current sample in the data sequence. A FIR filter can be implemented as an adaptive filter that is updated during data processing based on previously processed samples.

SUMMARY

In an audio data sequence representing an audio signal, crackles or other impulsive noise elements are identified using an adaptive filter. The identified crackles can be removed directly from the audio data sequence using interpolation or smoothing techniques. Thus, the audio signal can be restored with high precision and efficiency.

In general, in one aspect, the present invention provides a method and apparatus, including computer program products, for restoring audio signals. The method includes receiving a data sequence of samples that represent an audio signal, defining multiple filter coefficients for a filter, and selecting a current sample to be processed in the data sequence. The filter coefficients are updated based on a previous sample preceding the current sample in the data sequence and a filtered value determined by the filter for the previous sample. A filtered value for the current sample is determined using the filter with the updated filter coefficients, and the filtered value of the current sample is used to determine whether the current sample has been corrupted by impulsive noise.

Particular implementations can include one or more of the following features. The samples can be ordered in the data sequence according to an increasing time in the audio signal. The method can further include selecting another current sample, and repeating the steps of updating the filter coefficients based on a previous sample and a filtered value for the previous sample, and determining a filtered value for the current sample using the filter with the most recently updated filter coefficients.

The filter can include a finite impulse response filter. The filter can include a causal filter. The filter coefficients can be updated using a least mean square algorithm. Updating the filter coefficients can include adding to each filter coefficient a term that is linearly proportional to a difference between a previous sample and the filtered value for the previous sample. Updating the filter coefficients can include updating each filter coefficient based on a difference between a previous sample immediately preceding the sample in the data sequence and a filtered value for the previous sample.

Using the filtered value of the current sample to determine whether the current sample has been corrupted by impulsive noise can include determining whether the current sample has been corrupted by a crackle. Determining whether the current sample has been corrupted by a crackle can include determining whether the current sample has been corrupted based on a difference between the current sample and the filtered value of the current sample. Determining whether the current sample has been corrupted can include generating an envelope that defines a local intensity for the current sample based on respective differences between two or more samples in the data sequence and filtered values corresponding to the two or more samples. A local threshold can be defined for the current sample in the data sequence based on the generated envelope. The current sample can be identified as being corrupted by a crackle if the local threshold for the sample is exceeded by the difference between the current sample and the filtered value of the current sample. Generating the envelope can include using an exponential smoother.

If the current sample is determined to be a corrupted sample that has been corrupted by impulsive noise, a corresponding restored value can be determined based on samples in a neighborhood surrounding the corrupted sample in the data sequence. The restored value can be used to replace the value of the corrupted sample. Determining the restored value based on samples in the neighborhood of the corrupted sample can include interpolating based on the samples in the neighborhood surrounding the corrupted sample in the data sequence. A smoothened value can be determined for a sample in the neighborhood surrounding the corrupted sample, and the smoothened value can be used to replace the value of that sample in the neighborhood. Determining the smoothened value can include smoothing and interpolation with finite differences.

Particular embodiments can be implemented to realize one or more of the following advantages. Impulsive noise, such as crackles, can be removed from a corrupted audio signal using simple techniques. Thus, the audio signal can be restored without extensive calculations, such as those required for linear prediction techniques. Crackles can be removed from the audio signal without splitting the signal into a "clean" part and a "crackled" part, and separately processing the crackled part to remove the crackles. Instead, the crackles can be removed directly from the audio signal. Thus, the audio restoration technique can avoid problems that are caused by noise residues in the "clean" part of the audio signal. The audio signal can be restored in real time using a general purpose computer, such as a personal computer. Thus, the audio signal can be restored in real time without using highly specialized, expensive hardware. The audio restoration can efficiently remove crackles form the corrupted audio signal without degrading the quality of the clean audio signal. For example, the audio signal can be restored without altering non-corrupted portions of the audio signal. The audio restoration can avoid falsely detecting musical attacks, such as drum beats, as crackles. The audio restoration can be implemented in software products that have compact code sizes. The audio restoration can be implemented using simple algorithms that require relatively simple computations and small CPU time. The audio restoration can be optimized to a desired trade-off between audio quality and CPU time.

DETAILED DESCRIPTION

Figure 1:
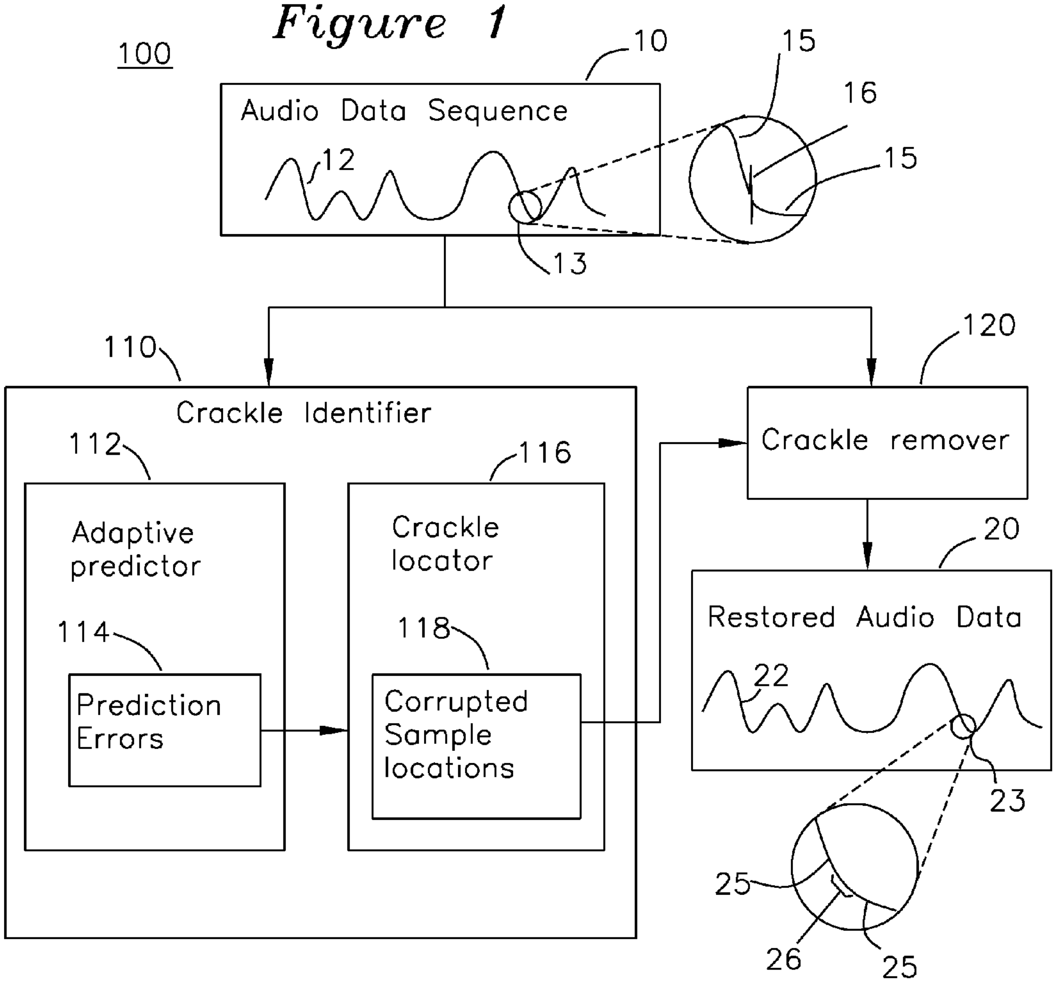
FIG. 1 is a schematic block diagram illustrating a system for restoring audio signals.

FIG. 1 illustrates a system 100 for restoring an audio signal that is represented by an audio data sequence 10. The audio signal includes impulsive noise, such as crackles, that can be removed by the system 100. The system 100 includes a crackle identifier 110 and a crackle remover 120. The crackle identifier 110 identifies crackles in the audio data sequence 10, and the crackle remover 120 removes the identified crackles from the corrupted audio signal to generate a restored audio data sequence 20.

The audio data sequence 10 includes a time ordered sequence of samples 12. The samples 12 can be generated by sampling an analog audio signal. For example, the analog signal can be periodically sampled at a single rate between about 16,000 and about 96,000 samples per second. Instead of using a single rate, the audio signal can be sampled at a rate that varies according to some parameters of the audio signal.

The audio data sequence 10 represents an audio signal that is corrupted by impulsive noise, such as crackles. For example, the audio data sequence 10 can represent an audio signal from an old phonographic record or an audio signal received through a noisy transmission. Such audio signals can include several tens of crackles per second. Each crackle is a short, small amplitude impulse that is superimposed over the clean audio signal. In FIG. 1, an exemplary crackle is illustrated in an enlarged data portion 13 of the audio data sequence 10. The data portion 13 includes "clean" samples 15 that represent the audio signal without noise, and "corrupted" samples 16 that represent contributions from both the clean signal and the crackle. The crackle's contribution can include positive and negative portions. At a sampling rate between about 16,000 and about 96,000 samples per second, a single crackle typically corrupts only a few samples, such as less than about 250 samples, for example, less than about 50 samples in the data sequence 10.

The crackle identifier 110 receives the audio data sequence 10 in which it identifies samples that are corrupted by crackles. The crackle identifier 110 includes an adaptive predictor 112 and a crackle locator 116. In one implementation, the adaptive predictor 112 includes a FIR filter that determines a respective filtered value for each sample. The FIR filter can be a causal filter that determines the filtered value for a current sample based on samples preceding the current sample in the data sequence 10. For each sample, the filtered value (which is also referred to as a "predicted value") is compared to the sample's value to generate a corresponding prediction error 114. In alternative implementations, the prediction errors 114 can be generated by adaptive predictors including other filters than a FIR filter. For example, the prediction errors 114 can be generated by a predictor that includes an infinite impulse response (IIR) filter that, unlike the FIR filter, determines a current filtered value based on one or more previous filtered values.

In the predictor 112, the FIR filter has a finite number of filter coefficients that are periodically updated based on previous prediction errors 114. For example, the filter coefficients can be updated after each prediction, or after multiple predictions. In one implementation, the predictor 112 is updated to minimize the prediction errors 114 for samples representing the audio signal. The average level of the minimized prediction error is, in general, proportional to a local average power of the audio signal. The crackles are short additive impulses that the updated predictor 112 cannot predict with the same accuracy as the values of the clean samples. Thus for the same average power of the audio signal, the prediction errors 114 are expected to be larger for samples corrupted with crackles than for samples representing the clean audio signal only.

The crackle locator 116 analyzes the prediction errors 114 to identify corrupted sample locations 118. Because the prediction errors 114 are expected to be larger for corrupted samples than for clean samples, the crackle locator 116 can identify corrupted samples for which the prediction error 114 is larger than a threshold. The threshold can be a local threshold that is determined for each sample based on a local property. For example, the local property can include an average intensity in a neighborhood surrounding the sample in the audio data sequence 10. Alternatively, the local threshold can be determined based on a local property in the sequence of prediction errors 114. For example, the local threshold can be based on a local average of intensities of the prediction errors 114. If the crackles have a typical waveform in the sequence of prediction errors 114, identifying the crackles can include determining correlations between the typical crackle waveform and the prediction errors 114. From the correlations, the crackles can be identified by using an appropriate thresholding technique. In the sequence of prediction errors 114, the crackles' typical waveform can be affected by the particular predictor 112. Thus, instead of using an average crackle waveform in the audio data sequence 10, one can specify a typical crackle waveform based on an average crackle waveform in the prediction errors 114 generated by the particular predictor 112.

The crackle remover 120 receives the audio data sequence 10 and the corrupted sample locations 118 from which it generates a restored audio data sequence 20 that represents a restored audio signal. The crackle remover 120 determines restored values for corrupted samples, and replaces the corrupted sample values with the restored values to generate the restored audio data sequence 20.

The restored audio data sequence 20 includes a time ordered sequence of samples 22. The samples 22 include the restored values for the corrupted samples and the original values of "clean" samples from the audio data sequence 10. FIG. 1 illustrates an exemplary enlarged data portion 23 of the restored audio data sequence. The data portion 23 of the restored data sequence 20 corresponds to the enlarged data portion 13 in the received audio data sequence 10. The data portion 23 includes clean samples 25 and restored samples 26. The clean samples 25 have the same values as the clean samples 15 in the original data sequence 10, and the restored samples 26 have restored values that replace the corrupted samples 16 representing a crackle in the original data sequence 10.

The crackle remover 120 generates restored values for corrupted samples that have been identified by the corrupted sample locations 118. For example, the crackle remover 120 can determine the restored values by using an interpolation that is based on clean samples in local neighborhoods surrounding the identified corrupted samples in the audio data sequence 10. The crackle remover 120 can also use a smoothing technique to enforce some predefined smoothness requirements for the restored values.

In addition to the corrupted samples at the identified locations 118, crackles may have corrupted samples in a finite neighborhood surrounding the identified locations 118. Although the sound corruption in the neighborhood is typically smaller than at the identified locations 118, these corrupted neighborhood samples may substantially degrade the quality of interpolation used to generate the restored values for the identified corrupted samples. To determine restored values for all corrupted samples in such neighborhood, the crackle remover 120 can use a weight function for the interpolation. The weight function specifies a respective weight for each sample in the neighborhood. Each weight is a measure of confidence that the corresponding sample is not corrupted. For example, these weights can increase with increasing distance from the identified corrupted sample locations 118.

Figure 2:
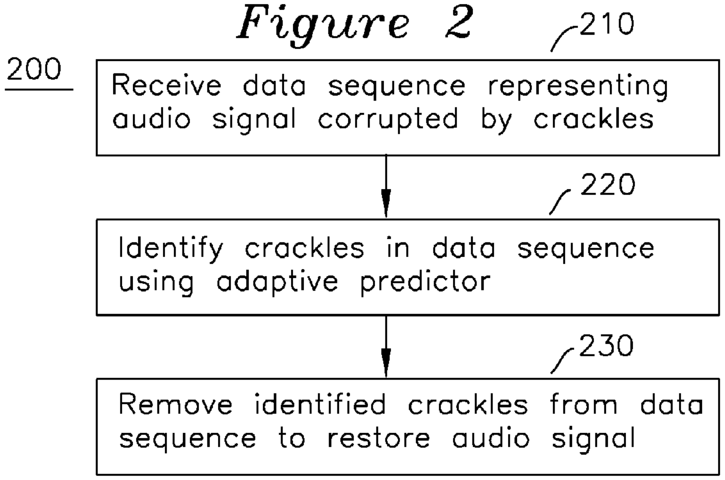
FIGS. 2, 3, 5 and 6 are schematic flow charts illustrating methods for restoring audio signals.

FIG. 2 illustrates a method 200 for restoring corrupted audio signals. The method 200 can be performed by an audio restoration system that identifies crackles in an audio signal using an adaptive predictor, such as the adaptive predictor 112 (FIG. 1).

The system receives an audio data sequence representing an audio signal corrupted by crackles (step 210). The audio data sequence includes time ordered samples representing the audio signal. The audio data samples can be received from an analog-to-digital converter "in real time" (in other words, "on the fly"). Alternatively, the audio data sequence can be stored in a memory or on a digital media in a storage device, and received from that memory or storage device.

The system identifies crackles in the data sequence using an adaptive predictor (step 220). In one implementation, the adaptive predictor includes a FIR filter. For each sample in the data sequence, the FIR filter generates an estimated value that is compared to the sample's value to measure a respective prediction error for the sample. The measured prediction error is used to update the FIR filter in the predictor. The system also analyzes the prediction errors to identify samples that have been corrupted by crackles. In one implementation, the system identifies corrupted samples for which the prediction error is larger than a local threshold. Alternatively, identifying the corrupted samples can also include specifying a waveform for crackles and comparing that waveform with the sequence of prediction errors.

The system removes the identified crackles from the data sequence to restore the audio signal (step 230). The system determines restored values for the corrupted samples and replaces the corrupted sample values with the corresponding restored values. The restored values can be determined by an interpolation based on clean samples surrounding the corrupted samples. In one implementation, the system replaces only those corrupted samples that have been identified in step 220. Alternatively, the system can use a smoothing technique to remove distortions that are caused by the crackles in neighborhoods surrounding the identified corrupted samples.

Figure 3:
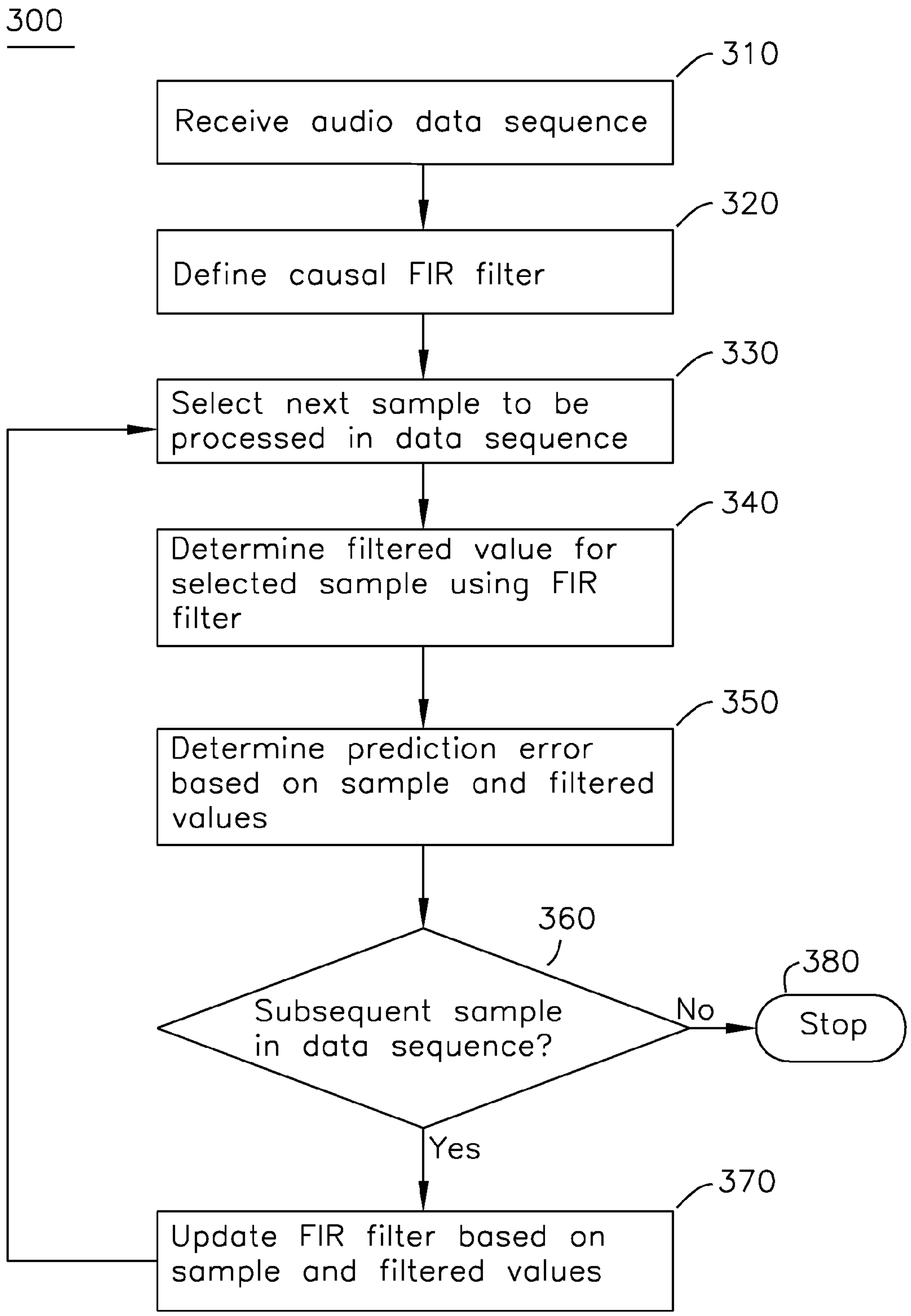

FIG. 3 illustrates a method 300 of processing an audio data sequence including a time ordered sequence of samples. The method 300 generates prediction errors for the samples in the audio data sequence. The generated prediction errors can be used to identify crackles in the audio data sequence. The method 300 can be performed by a system that includes a crackle identifier using an adaptive predictor, such as the adaptive predictor 112 with a FIR filter (FIG. 1).

The system receives an audio data sequence representing an audio signal corrupted by crackles (step 310). The data sequence includes time ordered samples whose values (x(1), x(2), . . . , x(n) . . . ) represent the audio signal at corresponding sample times (t(1), t(2), . . . , t(n) . . . ). The sample times can be uniformly or non-uniformly spaced. To simplify the following presentation, uniformly spaced sample times are assumed, and reference to the sample times are omitted. Processing uniform and non-uniform sample time spacings is well known in the prior art.

The system defines a causal FIR filter (step 320). The causal FIR filter provides a filtered value for each currently processed sample based on the current sample or previous samples that precede the current sample in the data sequence. In one implementation, the causal FIR filter is defined by a finite number (N) of filter coefficients ($a_1, a_2, \ldots, a_N$), where each coefficient is associated with a respective previous sample. The finite number N of filter coefficients can be less than ten, for example, five.

The FIR filter's coefficients can be initialized to predetermined values. For example, all filter coefficients can have the same initial value, such as zero. Alternatively, the system can analyze the received data sequence, and determine the initial values of the filter coefficients based on a result of the analysis.

The system selects a next sample to be processed in the data sequence (step 330). In a first iteration, the system selects a sample (x(n)) that is preceded in the data sequence by at least N samples, where N is the number of coefficients in the FIR filter.

The system determines a filtered value for the selected sample using the FIR filter (step 340). In one implementation, the FIR filter uses a finite number (N) of previous samples (x(n−1), x(n−2), . . . , x(n−N)) that immediately precede the selected sample in the data sequence. Thus, the filtered value (y(n)) for the selected sample is determined as $$y(n)=a_1x(n-1)+a_2x(n-2)+\ldots+a_Nx(n-N) \quad \text{(Eq. 1).}$$

In alternative implementations, the FIR filter can also use non-adjacent previous samples to determine the filtered value y(n).

The system determines a prediction error based on a difference between the sample value and the filtered value (step 350). For example, the prediction error (e(n)) can be defined by subtracting the filtered value y(n) from the sample value x(n), that is, e(n)=x(n)−y(n). Alternatively, the prediction error can be defined as a monotone function of x(n)−y(n).

The system determines whether there is a subsequent sample to be processed in the audio data sequence (decision 360). If there is such a sample ("Yes" branch of decision 360), the system updates the FIR filter's coefficients based on the sample value x(n) and the filtered value y(n) (step 370).

In one implementation, the system updates the filter coefficients according to a least mean square ("LMS") algorithm. Accordingly, each filter coefficient ($a_k$, k=1, . . . , N) is updated to an updated value ($a_k'$, k=1, . . . , N) by a term that is proportional to the respective previous sample value x(n−k) and the prediction error e(n) defined as the difference between the sample value x(n) and the filtered value y(n). Thus, e(n)=x(n)−y(n) and the k-th (k=1, . . . , N) filter coefficient is updated as $$a_k' = a_k + u e(n) x(n-k)/W \quad \text{(Eq. 2)},$$

where u is an adaptation constant and W is a normalization factor. The normalization factor W can depend on the previous samples (x(n−1), x(n−2), . . . , x(n−N)). For example, the normalization factor W can be determined as $$W = x(n-1)^2 + x(n-2)^2 + \ldots + x(n-N)^2 \quad \text{(Eq. 3)}.$$

In alternative implementations, the normalization factor W can be omitted from Eq. 2.

The adaptation constant u defines an amplitude for the adaptation step. For example, the adaptation constant u can be between about 0.00005 and about 0.005. The adaptation constant's value can be selected based on the sampling rate. Typically, smaller adaptation constants are preferred for larger sampling rates. In one implementation, the adaptation constant u is about 0.005 for sampling rates below 44,100 samples per second, and exponentially decreases from that value for sampling rates ("SR") above 44,100 samples per second. For example, the adaptation constant can decrease based on the sampling rate SR (in units of samples per second) as $$u = 0.005(0.01)^{(SR/44100-1)} \quad \text{(Eq. 4)}.$$

In alternative implementations, the system can use other adaptation algorithms to update the filter coefficients. For example, the system can use a recursive least squares ("RLS") algorithm. Or the updated filter coefficients $a_k'$(k=1, . . . , N) can be used to determine a new filtered value y'(n) from which a new prediction error e'(n) can be determined for the same sample x(n). The new prediction error e'(n) can be used to determine "twice updated" filter coefficients $a_k''$ (k=1, . . . , N) using an equation similar to Eq. 2.

The system returns to step 330 to select a next sample to be processed in the data sequence, determines a filtered value for the selected sample using the FIR filter with the updated coefficients (step 340), and determines a prediction error from the filtered and sample values (step 350). If there are still samples to be processed ("Yes" branch of decision 360), the system performs another iteration of updating the FIR filter's coefficients (step 370), selecting the next sample to be processed (step 330) and determining a filtered value and a prediction error for the selected sample (steps 340 and 350). If there are no more subsequent samples to be processed ("No" branch of decision 360), the system stops processing the audio data sequence (step 380).

Thus, the system has generated prediction errors e(n) that can be used to locate crackles in the audio data sequence by a crackle locator, such as the crackle locator 116 (FIG. 1).

Figure 4:
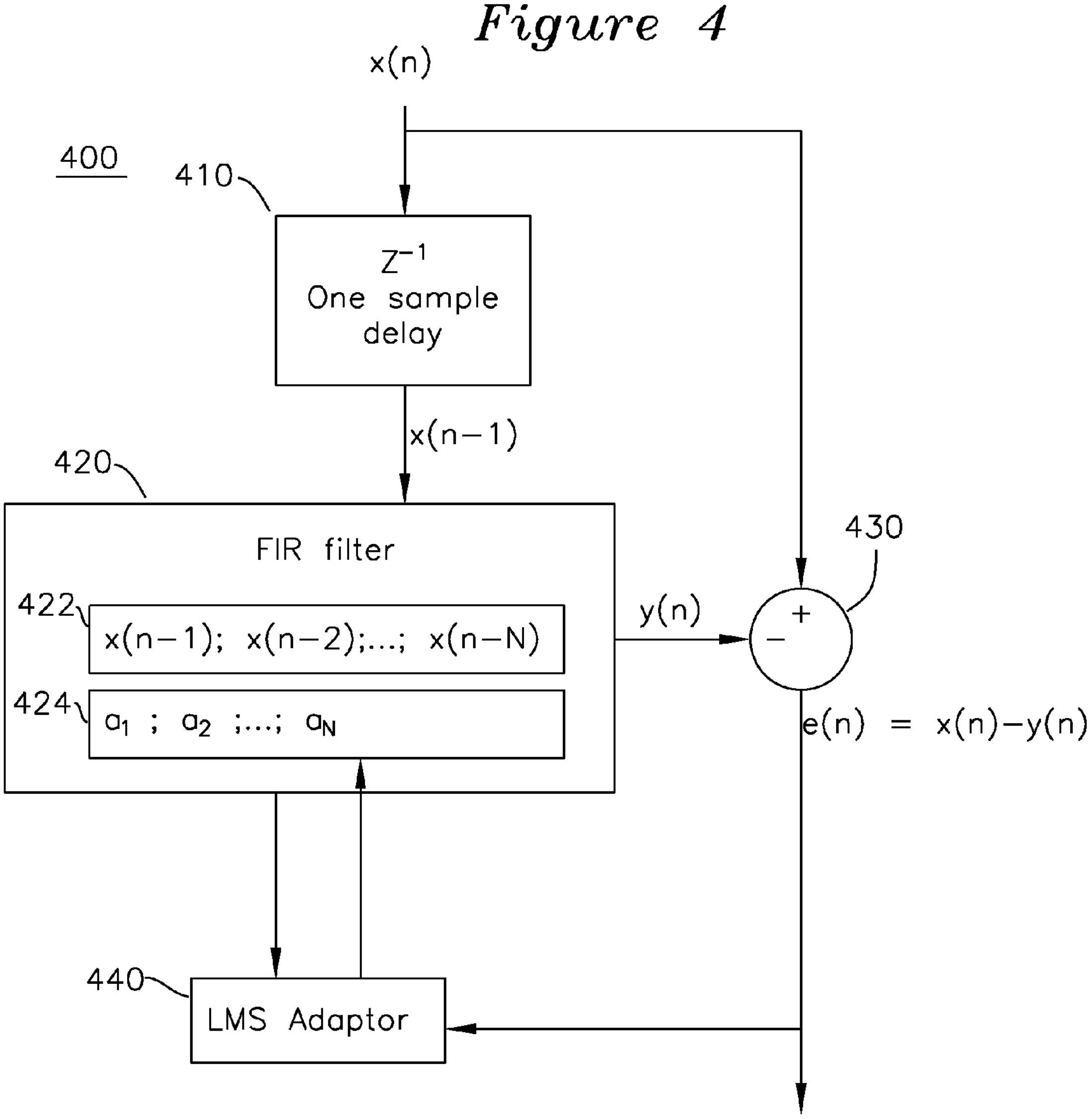
FIG. 4 is a schematic block diagram illustrating an exemplary adaptive FIR predictor for processing audio data.

FIG. 4 illustrates a system 400 using a FIR filter to implement an adaptive predictor, such as the adaptive predictor 112 (FIG. 1). The system 400 includes a delay unit 410, a FIR filter 420, a difference calculator 430, and an LMS adaptor 440.

The delay unit 410 receives an audio data sequence including multiple samples (x(1), . . . , x(n), . . . ). The samples are received sequentially, one sample at time, and the delay unit 410 outputs the received sample with a one-sample delay. Thus, when the delay unit 410 receives the $n^{th}$ sample x(n), it outputs the $(n-1)^{th}$ sample x(n−1).

The FIR filter 420 is a causal FIR filter defined by a finite number (N) of filter coefficients ($a_1, a_2, \ldots, a_N$) 424. The FIR filter 420 uses the currently received sample x(n−1) and N−1 previously received samples (x(n−2), . . . , x(n−N)) to determine a filtered value (y(n)) for the sample x(n) currently received by the delay unit 410. For example, the FIR filter 420 can calculate the filtered value y(n) according to Eq. 1.

The difference calculator 430 receives the current sample x(n) and the filtered value y(n), and determines a prediction error e(n) by subtracting the filtered value y(n) from the sample value x(n). The prediction error e(n) is output, and can be further processed by another device.

The LMS adapter 440 receives the prediction error e(n). The LMS adaptor also receives the current values of filter coefficients ($a_1, a_2, \ldots, a_N$) 424 and the previous samples (x(n−1), x(n−2), . . . , x(n−N)) 422 from the FIR filter 420. Based on the prediction error e(n), the current filter coefficients and the previous samples, the LMS adaptor 440 updates the filter coefficients in the FIR filter 420. For example, the filter coefficients can be updated according to Eq. 2. In alternative implementations, the LMS adaptor 440 can be replaced by another adaptor, such as an RLS adaptor.

The system 400 repeats the above operation steps for each sample of the audio data sequence, and thus generates and outputs a sequence of prediction errors corresponding to the received audio data sequence. The output prediction errors can be used to locate crackles in the corresponding audio data sequence by a crackle locator, such as the crackle locator 116 (FIG. 1).

Figure 5:
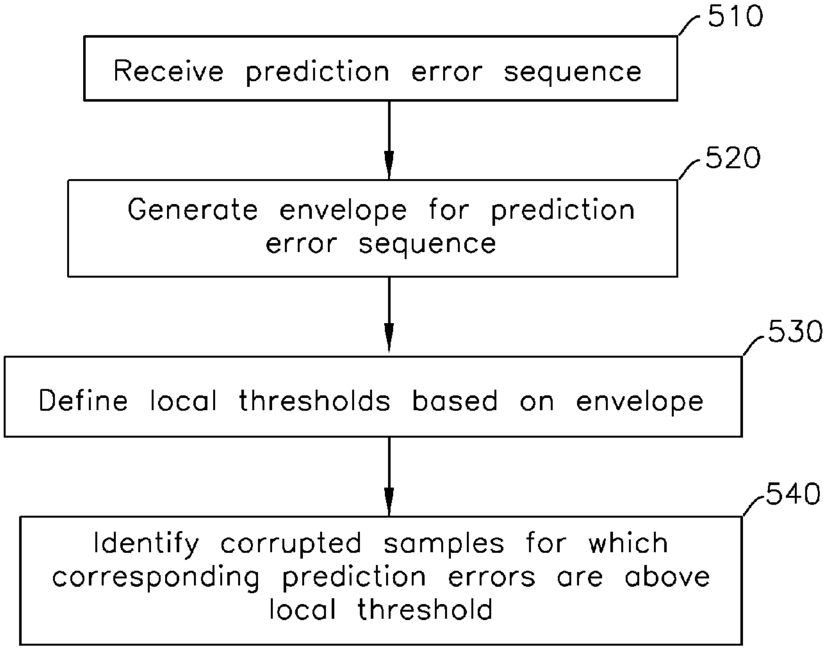

FIG. 5 illustrates a method 500 for identifying samples corrupted by crackles in an audio data sequence. The method 500 can be performed by a system including a crackle locator, such as the crackle locator 116 (FIG. 1).

The system receives a prediction error sequence including prediction errors (e(1), e(2), . . . , e(n), . . . ) corresponding to an audio data sequence (step 510). The prediction error sequence can be received from an adaptive predictor that generates predicted values for the audio data sequence. For example, the prediction error sequence can be received from the adaptive predictor 112 (FIG. 1) or the system 400 (FIG. 4).

The system generates an envelope for the received prediction error sequence (step 520). The envelope provides an estimate of a respective "strength" or "amplitude level" at each sample in the error sequence. The envelope can be specified by a sequence of envelope values (d(1), d(2), . . . , d(n), . . . ) corresponding to respective values (e(1), e(2), . . . , e(n), . . . ) in the received prediction error sequence. Each envelope value can be generated based on a local average in the prediction error sequence. For example, the envelope can be a root mean square (RMS) envelope estimating a local power level in the prediction error sequence.

In one implementation, the envelope is calculated by an infinite impulse response (IIR) filter. Unlike the finite impulse response (FIR) filter, the IIR filter determines a current filtered value based on one or more previous filtered values. Thus, the envelope value d(n) for the $n^{th}$ prediction error value e(n) can be calculated using not only the error value e(n) of the $n^{th}$ prediction error but also the $(n-1)^{th}$ envelope value d(n−1). Thus, the $n^{th}$ envelope value can be determined according to a smoothing coefficient ("g") as $$d(n)=gd(n-1)+(1-g)|e(n)| \quad \text{(Eq. 5)},$$

where |e(n)| denotes the absolute value of e(n). In alternative implementations, the absolute value function can be replaced by another measure of strength or amplitude level for the prediction error.

The smoothing coefficient g determines a range over which the prediction errors are averaged. If the smoothing coefficient g is close to zero, the averaging range includes only a single prediction error, thus the envelope value d(n) is substantially the same as the absolute value of e(n). As the smoothing coefficient g increases, the averaging range increases as well, because more and more prediction errors contribute to the current envelope value through the previous envelope value d(n−1).

The smoothing coefficient g can be selected based on the sampling rate of the audio data sequence. For a sampling rate of about 44,100 samples per second, the smoothing coefficient can be selected to be between about 0.997 and about 0.9984. The smoothing coefficient g can also be determined based on the sampling rate (SR) and a time constant (T) as $$g=0.25^{1/(TSR)} \quad \text{(Eq. 6)}.$$

The time constant T can be selected to optimize crackle detection. The audio data often represent abruptly changing sound intensity, such as drum beats or other "musical attacks." By setting an appropriate value for the time constant T, the system can avoid mistakenly detecting such musical attacks as crackles. When the sampling rate SR is in units of samples per second, the time constant T can be set to have a value between about 0.01 second and about 0.02 second.

The system defines a local threshold based on the generated envelope (step 530). The local threshold can be linearly proportional to the envelope. Thus, for each prediction error e(n), the local threshold (h(n)) is defined based on a threshold control parameter (H) and the envelope value d(n) corresponding to that prediction error as $$h(n)=Hd(n) \quad \text{(Eq. 7)}.$$

The threshold control parameter H can have a value between about one and about ten. In alternative implementations, the local threshold can be a non-linear function of the envelope values.

The system identifies corrupted samples for which the corresponding prediction errors are above the local threshold (step 540). If the absolute value of the prediction error (|e(n)|) is larger than the corresponding local threshold h(n), the system identifies the sample corresponding to that prediction error as being corrupted by a crackle. If the absolute value of the prediction error (|e(n)|) is smaller than the corresponding local threshold h(n), the system does not identify the sample as being corrupted by a crackle. However, the system can treat some samples as "suspects" of being corrupted even if they have a prediction error below the local threshold. Such "suspect samples" can include those that are in a neighborhood of a sample that is identified as being corrupted by a crackle.

In one implementation, the system determines a crackle likelihood function (L) that characterizes the likelihood that samples are corrupted by a crackle. For each sample (x(n)), the likelihood function's value L(n) is a measure of the difference between the prediction error's magnitude (|e(n)|) and the local threshold h(n). For example, the likelihood L(n) is zero if the prediction error's magnitude |e(n)| is smaller than the local threshold h(n); and the likelihood L(n) is one if the prediction error's magnitude |e(n)| is larger than an upper threshold B(n). The upper threshold B(n) is larger than, and can be proportional to, the local threshold h(n). Between h(n) and B(n), the likelihood L(n) can change linearly or according to some other monotone function between zero and one. The likelihood function L can be used to define a sophisticated crackle identifier or can be used by a crackle remover.

Figure 6:
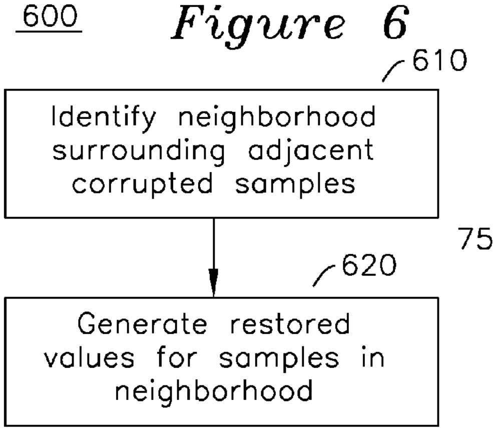

FIG. 6 illustrates a method 600 of generating reconstructed values for samples in an audio data sequence. The audio data sequence represents an audio signal corrupted by crackles, and includes samples that have been identified as corrupted samples. The method 600 can be performed by a system including a crackle remover such as the crackle remover 120 (FIG. 1).

The system identifies a respective neighborhood of each group of one or more adjacent corrupted samples (step 610). The neighborhood can include a predefined number of samples surrounding the identified corrupted samples. For example, the neighborhood can include about 15 samples in each direction from a group of adjacent corrupted samples. Alternatively, the size of the neighborhood can depend on the number of adjacent corrupted samples, the sampling rate of the audio data sequence, or the magnitude or length of the crackle at the group of corrupted samples.

The system generates restored values for samples in the neighborhood (step 620). The restored values can be determined for the identified corrupted samples by an interpolation based on samples that have not been identified as being corrupted in the neighborhood. The system can also use a smoothing technique to remove distortions that are caused in the neighborhood by the identified crackle.

In one implementation, the restored values are determined using smoothing and interpolation with finite differences. These techniques try to minimize a cost function (CF) that depends on both smoothness requirements and the differences between the sample values (x(n), . . . , x(m)) and the respective restored values (z(n), . . . z(m)) in the neighborhood surrounding the identified corrupted samples in the audio data sequence. In the cost function CF, the smoothness requirements can be represented by second differences ($\Delta^2 z_i$, i=n+2, . . . , m) of the restored values $z_i$ based on respective preceding values $z_{i-1}$ and $z_{i-2}$, as $$\Delta^2 z_i=z_i-2z_{i-1}+z_{i-2} \quad \text{(Eq. 8)}.$$

The cost function CF can be defined as two sums (Σ), where the first sum represents the differences between the sample and restored values and the second sum represents the smoothness $$CF=\Sigma_{i=n,\ldots,m} w_i(x_i-z_i)^2+\lambda\Sigma_{i=n+2,\ldots,m}(\Delta^2 z_i)^2 \quad \text{(Eq. 9)}.$$

In the cost function, a smoothing strength λ provides the relative importance of smoothness. The higher the value of lambda, the smoother the restored values will be. For example, the smoothing strength λ can be between about 1 and about 100. The cost function CF can be minimized using standard techniques.

In the cost function CF, each difference between sample and restored values has a corresponding weight $w_i$. The weights $w_i$ can be selected according to a measure of confidence that the corresponding sample is non-corrupted. For example, the weight $w_i$ is selected to be zero for samples that have been identified as being corrupted, and the weight $w_i$ is selected to be one for samples that are thought to represent the clean audio signal. For intermediate levels of confidence, the weight $w_i$ can be selected to be between zero and one. Alternatively, the weight $w_i$ can be selected based on a likelihood function L.

Figure 7:
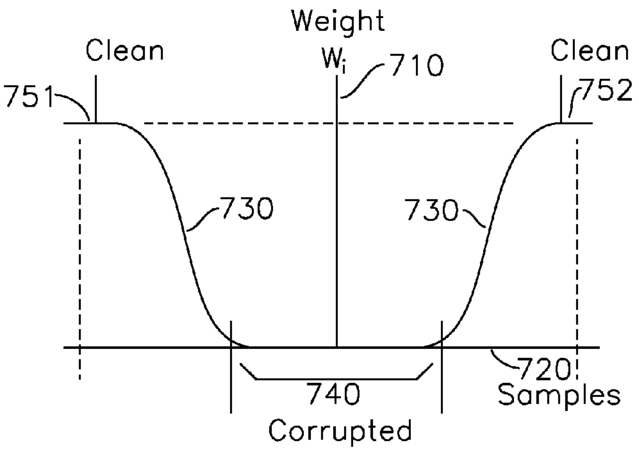
FIG. 7 is a schematic diagram illustrating a weight function for replacing corrupted samples in an audio data sequence.

FIG. 7 illustrates a diagram 700 representing exemplary values for the weights $w_i$ in the cost function CF. The diagram 700 illustrates the weights $w_i$ on a vertical axis 710. A horizontal axis 720 represents samples corresponding to a neighborhood in the audio data sequence. For each sample in the neighborhood, the corresponding weight $w_i$ is represented by a curve 730. The weights $w_i$ have a value of zero for samples 740 that have been identified as being corrupted, and weights $w_i$ have a value of one for samples 751 and 752 that are far enough from the identified corrupted samples so that they are likely to represent clean audio signal. Samples that are close to the identified corrupted samples have intermediate values.

The techniques of the present application have been described with reference to particular implementations. Other implementations are within the scope of the following claims, and can include many variations. For example, the audio restoring technique or portions of it can be implemented by processing analog signals. The described techniques can be implemented in software, hardware, or in a combination of software and hardware, or in a method, system, apparatus, or computer program product. Steps in the described methods can be performed in different order and still provide desirable results.

What is claimed is:

1. A computer-implemented method for restoring audio signals, the method comprising:

receiving a data sequence including a plurality of samples representing an audio signal;

defining a plurality of first filter coefficients for a first filter;

selecting a current sample to be processed in the data sequence;

updating the first filter coefficients based on a previous sample preceding the current sample in the data sequence and a filtered value determined by the first filter for the previous sample, said updating the first filter coefficients occurring for each new current sample;

determining a filtered value for the current sample using the first filter with the updated first filter coefficients;

using the value of the filtered current and filtered previous samples to determine whether the current and previous samples have been corrupted by impulsive noise, the filtered value of the current and previous samples thereby indicating either a corrupted region, an uncorrupted region, or a neighborhood uncorrupted region adjacent to a corrupted region and to an uncorrupted region;

whereby:

each said current and previous sample has an associated variable W which has a minimum value in said corrupted region and a maximum value in said uncorrupted region, said variable W in said neighborhood uncorrupted region varying monotonically from said minimum value adjacent to said corrupted region to said maximum value adjacent to said neighborhood uncorrupted region;

when the filtered value of the current and previous samples indicates an uncorrupted region, providing the current sample as an output;

when the filtered value of the current and previous samples indicates a neighborhood uncorrupted region or corrupted region, computing a restored value by minimizing a cost function value CF which is the sum of a first term and a second term, where the first term is computed from the differences between the sample and restored values, and the second term is computed from second differences of the restored values based on preceding restored values.

2. The method of claim 1 where said first term is computed by squaring each difference term computed by subtracting each said restored value from a corresponding sample value, each said squared difference term multiplied by said W variable.

3. The method of claim 1 where said second term is computed by multiplying a smoothness term λ with the sum of squared second differences of the restored values where said second difference of a restored value $z_i$ is $z_i-2\,z_{i-1}+z_{i-2}$.

4. The method of claim 1 where said second term is λ*

$$\lambda * \sum_{i=n+2,\ldots,m} (\Delta^2 z_i)^2.$$

5. The method of claim 4 where said λ has a value between 1 and 100.

6. The method of claim 1 where said first term is $$\sum_{i=n,\ldots,m} w_i (x_i - z_i)^2.$$

7. The method of claim 6 where said $W_i$ minimum value is 0 and said $W_i$ maximum value is 1.

8. The method of claim 1 where said cost function CF is minimized by the selection of said restored value zi, and said CF=

$$CF = \sum_{i=n,\ldots,m} w_i (x_i - z_i)^2 + \lambda * \sum_{i=n+2,\ldots,m} (\Delta^2 z_i)^2,$$

where said Wi minimum value is 0, said Wi maximum value is 1, and said λ has a value from 1 to 100.

9. The method of claim 1 where said neighborhood uncorrupted region contains about fifteen samples.

10. The method of claim 1 where using the filtered value of the current and previous samples to determine whether the current and previous samples have been corrupted by impulsive noise includes identifying said corrupted region by generating an envelope from said filtered value and examining said envelope to determine when said samples are corrupted.

11. The method of claim 10 where said envelope is calculated from the output of an infinite impulse response filter (IIR) coupled to said first filter output.

12. The method of claim 11, wherein generating an envelope includes generating an envelope using an exponential smoother.

13. The method of claim 1, further comprising:

if the current sample is determined to be a corrupted sample that has been corrupted by impulsive noise, determining a corresponding restored value based on samples in said neighborhood uncorrupted region surrounding the corrupted sample in the data sequence, and using the restored value to replace the value of the corrupted sample.

14. The method of claim 13, wherein determining the restored value based on samples in the neighborhood uncorrupted region surrounding the corrupted region includes interpolating restored values from a corrupted region and a neighborhood uncorrupted region based on the samples in the neighborhood uncorrupted region surrounding the corrupted region in the data sequence.

15. The method of claim 13, further comprising:

determining a smoothened value for a least one sample in the neighborhood uncorrupted region surrounding the corrupted region, and using the smoothened value to replace the value of the at least one sample in the neighborhood uncorrupted region.

16. The method of claim 15, wherein determining a smoothened value for the at least one sample in the neighborhood includes smoothing and interpolation with finite differences.

17. A software product for restoring audio signals, tangibly embodied as instructions for use by a computer, the instructions causing the computer to perform operations comprising:

receiving a data sequence including a plurality of samples representing an audio signal;

defining a plurality of first filter coefficients for a first filter;

selecting a current sample to be processed in the data sequence;

updating the first filter coefficients based on a previous sample preceding the current sample in the data sequence and a filtered value determined by the first filter for the previous sample, said updating the first filter coefficients occurring for each new current sample;

determining a filtered value for the current sample using the first filter with the updated first filter coefficients;

using the value of the current filtered sample and previous filtered samples to determine whether the current and previous samples have been corrupted by impulsive noise, the filtered value of the current and previous samples thereby indicating either a corrupted region, an uncorrupted region, or a neighborhood uncorrupted region adjacent to a corrupted region and to an uncorrupted region;

whereby:

each said current and previous samples has an associated variable W which has a minimum value in said corrupted region and a maximum value in said uncorrupted region, said variable W in said neighborhood uncorrupted region varying monotonically from said minimum value adjacent to said corrupted region to said maximum value adjacent to said neighborhood uncorrupted region;

when the filtered value of the current and previous samples indicates an uncorrupted region, providing the current sample as an output;

when the filtered value of the current and previous samples indicates a neighborhood uncorrupted region or corrupted region, computing a restored value by minimizing a cost function value CF which is the sum of a first term and a second term, where the first term is computed from the differences between the sample and restored values, and the second term is computed from second differences of the restored values based on respective preceding values.

18. The software product of claim 17 where said first term is computed by squaring each difference term computed by subtracting each said restored value from a corresponding sample value, each said squared difference term multiplied by said W variable.

19. The software product of claim 17 where said second term is computed by multiplying a smoothness term λ with the sum of squared second differences of the restored values where the second difference of a restored value $z_i$ is $z_i-2z_{i-1}+z_{i-2}$.

20. The software product of claim 17 where said second term is $$\lambda * \sum_{i=n+2,\ldots,m} (\Delta^2 z_i)^2.$$

21. The software product of claim 20 where said λ has a value between 1 and 100.

22. The software product of claim 17 where said first term is $$\sum_{i=n,\ldots,m} w_i (x_i - z_i)^2.$$

23. The software product of claim 22, where said $W_i$ minimum value is 0 and said $W_i$ maximum value is 1.

24. The software product of claim 17 where said cost function CF is minimized by the selection of said restored value zi, and said $$CF = \sum_{i=n,\ldots,m} w_i (x_i - z_i)^2 + \lambda * \sum_{i=n+2,\ldots,m} (\Delta^2 z_i)^2,$$

where said Wi minimum value is 0, said Wi maximum value is 1, and said λ has a value from 1 to 100.

25. The software product of claim 17 where said neighborhood uncorrupted region contains about fifteen samples.

26. The method of claim 17 where using the filtered value of the current and previous samples to determine whether the current and previous samples has been corrupted by impulsive noise includes identifying said corrupted region by generating an envelope from said filtered value and examining said envelope to determine when said samples are corrupted.

27. The software product of claim 26 where said envelope is calculated from the output of either a finite impulse response filter (FIR) or an infinite impulse response filter (IIR) coupled to said first filter output.

28. The software product of claim 27, wherein generating an envelope includes generating an envelope using an exponential smoother.

29. The software product of claim 17, further comprising instructions to cause data processing apparatus to perform operations comprising:

if the current sample is determined to be a corrupted sample that has been corrupted by impulsive noise, determining a corresponding restored value based on samples in said neighborhood uncorrupted region surrounding the corrupted sample in the data sequence, and using the restored value to replace the value of the corrupted sample.

30. The software product of claim 29, wherein determining the restored value based on samples in the neighborhood uncorrupted region surrounding the corrupted region includes interpolating restored values from a corrupted region and a neighborhood uncorrupted region based on the samples in the neighborhood uncorrupted region surrounding the corrupted region in the data sequence.

31. The software product of claim 27 where said envelope value has a value d(n) for the nth prediction error value e(n) which is calculated using only the error e(n) of the nth prediction error and the $n-1^{th}$ envelope value d(n−1).

32. The software product of claim 31 where said nth envelope value d(n) is determined according to a coefficient g where $d(n)=g*d(n-1)+(1-g)*|e(n)|$ and g is selected according to a sampling rate value SR and time constant T to improve crackle detection.

33. A system for restoring audio signals, the system comprising data processing apparatus configured to:

receive a data sequence including a plurality of samples representing an audio signal;

define a plurality of filter coefficients for a filter;

select a current sample to be processed in the data sequence;

update the filter coefficients based on a previous sample preceding the current sample in the data sequence and a filtered value determined by the filter for the previous sample, said update of the filter coefficients occurring for each new current sample;

determine a filtered value for the current sample using the filter with the updated filter coefficients;

use the value of the filtered current and filtered previous samples to determine whether the current and previous samples have been corrupted by impulsive noise, the filtered value of the current and previous samples thereby indicating either a corrupted region, an uncorrupted region, or a neighborhood uncorrupted region adjacent to a corrupted region and to an uncorrupted region;

whereby:

each said current and previous sample has an associated variable W which has a minimum value in said corrupted region and a maximum value in said uncorrupted region, said variable W in said neighborhood uncorrupted region varying monotonically from said minimum value adjacent to said corrupted region to said maximum value adjacent to said neighborhood uncorrupted region;

when the filtered value of the current sample indicates an uncorrupted region, providing the current sample as an output;

when the filtered value of the current sample indicates a neighborhood uncorrupted region or corrupted region, computing a restored value by minimizing a cost function value CF which is the sum of a first term and a second term, where the first term is computed from the differences between the sample and restored values, and the second term is computed from second differences of the restored values based on preceding restored values.

34. The system of claim 33, wherein said first term is computed by squaring each difference term computed by subtracting each said restored value from a corresponding sample value, each said squared difference term multiplied by said W variable and said second term is computed by multiplying a smoothness term λ with the sum of squared second differences of the restored values where said second difference of a restored value $z_i$ is $z_i-2\,z_{i-1}+z_{i-2}$.

35. The system of claim 34 where said W minimum value is 0 and said W maximum value is 1 and said λ has a value between 1 and 100.

36. An computer-implemented method for restoring audio signals, the method having the steps:

receiving a data sequence including a plurality of samples Xi representing an audio signal which includes at least one region of crackle;

providing said data sequence to a FIR having filter coefficients derived for each new sample from the output of said FIR filter;

identifying from said FIR filter output over said data sequence, in sequence: a first uncorrupted region, a first uncorrupted neighborhood region, a corrupted region, a second uncorrupted neighborhood region, and a second uncorrupted region;

associating, in sequence, a maximum weight value with said first uncorrupted region, a weight value which decreases from said maximum weight value to a minimum weight value over said first neighborhood region, a weight value which is equal to said minimum value over said corrupted region, a weight value which increases from said minimum value to said maximum value over said second uncorrupted neighborhood region, and said maximum value over said second uncorrupted region;

computing restored values Zi over said first uncorrupted neighborhood region, said corrupted region and said second uncorrupted neighborhood region, said restored values computed from minimizing a cost function CF, where said $$CF=\sum_{i=n,\ldots,m} w_i(x_i-z_i)^2+\lambda*\sum_{i=n+2,\ldots,m}(\Delta^2 z_i)^2,$$

and where said Wi minimum value is 0, said Wi maximum value is 1, and said λ has a value from 1 to 100.

* * * * *